US012349405B2

(12) United States Patent
Price et al.

(10) Patent No.: US 12,349,405 B2
(45) Date of Patent: Jul. 1, 2025

(54) TRANSISTOR AND ITS METHOD OF MANUFACTURE

(71) Applicant: PRAGMATIC SEMICONDUCTOR LIMITED, Cambridge (GB)

(72) Inventors: Richard Price, Sedgefield (GB); Nathaniel Green, Sedgefield (GB); Neil Davies, Sedgefield (GB); Adrian Thorndyke, Sedgefield (GB); Feras Alkhalil, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 0 days.

(21) Appl. No.: 18/516,465

(22) Filed: Nov. 21, 2023

(65) Prior Publication Data

US 2024/0088251 A1  Mar. 14, 2024

Related U.S. Application Data

(63) Continuation of application No. 17/673,940, filed on Feb. 17, 2022, now abandoned, which is a (Continued)

(30) Foreign Application Priority Data

Sep. 21, 2016 (GB) ...................... 1616081

(51) Int. Cl.
  *H10D 30/67* (2025.01)
(52) U.S. Cl.
  CPC ....... *H10D 30/673* (2025.01); *H10D 30/6739* (2025.01); *H10D 30/6755* (2025.01); *H10D 30/6736* (2025.01)
(58) Field of Classification Search
  CPC ........... H01L 29/42384; H01L 29/4908; H01L 29/7869; H01L 2029/42388
  (Continued)

(56) References Cited

U.S. PATENT DOCUMENTS 7,576,394 B2    8/2009  Furuta et al.
2003/0178617 A1  9/2003  Appenzeller et al.
(Continued)

OTHER PUBLICATIONS

International Search Report for International Application No. PCT/GB2017/052806, mailed Jan. 16, 2018.
(Continued)

*Primary Examiner* — Ori Nadav
(74) *Attorney, Agent, or Firm* — Jason H. Vick; Amped IP LLC

(57) ABSTRACT

A transistor is disclosed, comprising: a layer of semiconductor material comprising a first portion, a second portion, and a third portion connecting the first portion to the second portion and providing a semiconductive channel between the first portion and the second portion; a conductive first terminal covering and in electrical contact with said first portion of the layer of semiconductor material; a conductive second terminal covering and in electrical contact with said second portion of the layer of semiconductor material; a conductive gate terminal comprising a first overlapping portion covering at least part of the first terminal, and a channel portion covering the third portion of the layer of semiconductor material; and a layer of a first dielectric material, having a first dielectric constant, arranged between the first overlapping portion and the first terminal, and between the channel portion of the gate terminal and the third portion of the layer of semiconductor material. The transistor further comprises a layer of a second dielectric material having a second dielectric constant, the second dielectric constant being lower than the first dielectric constant, the layer of second dielectric material being arranged between at least part of the first overlapping portion and the first terminal, whereby at least part of the first overlapping portion of the gate terminal is separated from the first
(Continued)

terminal by the layer of first dielectric material and the layer of second dielectric material.

10 Claims, 10 Drawing Sheets

Related U.S. Application Data continuation of application No. 16/333,843, filed as application No. PCT/GB2017/052806 on Sep. 20, 2017, now abandoned.

(58) Field of Classification Search
USPC .......................................................... 257/59
See application file for complete search history.

(56) References Cited

U.S. PATENT DOCUMENTS

| 2007/0108446 | A1 | 5/2007  | Akimoto         |
|--------------|----|---------|-----------------|
| 2007/0272922 | A1 | 11/2007 | Kim et al.      |
| 2010/0032665 | A1 | 2/2010  | Yamazaki et al. |
| 2011/0114943 | A1 | 5/2011  | Yamazaki et al. |
| 2011/0133177 | A1 | 6/2011  | Suzawa et al.   |
| 2011/0156027 | A1 | 6/2011  | Yamazaki et al. |
| 2012/0025191 | A1 | 2/2012  | Yamazaki        |
| 2012/0043623 | A1 | 2/2012  | Doris et al.    |
| 2012/0261792 | A1 | 10/2012 | Cheng et al.    |
| 2012/0292700 | A1 | 11/2012 | Khakifirooz et al. |
| 2013/0285050 | A1 | 10/2013 | Yamazaki et al. |
| 2015/0137240 | A1 | 5/2015  | Cheng et al.    |
| 2019/0267462 | A1 | 8/2019  | Price et al.    |
| 2022/0173219 | A1 | 6/2022  | Price et al.    |

OTHER PUBLICATIONS

Written Opinion for International Application No. PCT/GB2017/052806, mailed Jan. 16, 2018.
International Preliminary Report on Patentability for International Application No. PCT/GB2017/052806, mailed Apr. 4, 2019.
Search Report for corresponding Great Britain Application No. 1616081.4, mailed Feb. 21, 2017.
Intention to Grant Under Section 18(4) for corresponding Great Britain Application No. 1616081.4, mailed Sep. 1, 2020.
Office Action (Restriction Requirement) for U.S. Appl. No. 16/333,843, mailed Dec. 8, 2020.
Office Action for U.S. Appl. No. 16/333,843, mailed Feb. 12, 2021.
Office Action for U.S. Appl. No. 16/333,843, mailed Aug. 20, 2021.
Office Action for U.S. Appl. No. 17/673,940, mailed May 25, 2023.
Examination Report Under Section 18(3) for corresponding Great Britain Application No. 1616081.4, mailed Jan. 17, 2020.
Notification of Grant or corresponding Great Britain Application No. 1616081.4, mailed Oct. 13, 2020.

TRANSISTOR AND ITS METHOD OF MANUFACTURE

CROSS REFERENCE TO RELATED APPLICATIONS

This application is a Continuation of U.S. patent application Ser. No. 17/673,940, filed Feb. 17, 2022, which is a Continuation of U.S. patent application Ser. No. 16/333,843, filed Mar. 15, 2019, which is a National Stage Application under 35 U.S.C. 371 of PCT Application No. PCT/GB2017/052806, having an international filing date of Sep. 20, 2017, which designated the United States, which PCT application claimed the benefit of Great Britain Application No. 1616081.4, filed Sep. 21, 2016, each of which are incorporated herein by reference in their entirety.

FIELD OF THE INVENTION

The present invention relates to transistors and their methods of manufacture, and in particular, although not exclusively, to thin film field effect transistors.

BACKGROUND TO THE INVENTION

Field effect transistors comprising source and drain terminals, and a gate terminal to which a voltage can be applied to control the conductivity of a semiconductive channel connecting the source and drain terminals are well known in a variety of particular forms. Typically, a dielectric material is arranged between the gate terminal and the channel of semiconductive material, and this dielectric material often takes the form of a layer of dielectric material which also covers the source and drain terminals. A known problem with such transistors is their parasitic capacitance resulting from the proximity of the gate terminal to the source and drain terminals (with dielectric material between them). This parasitic capacitance results in lower switching speeds and higher losses (for example in the form of higher heat dissipation). The parasitic capacitance, and hence these problems, increase if the gate terminal overlaps the source and/or drain terminals. Indeed, generally speaking, the greater the amount of overlap between the gate terminals and the source and drain terminals, the greater the parasitic capacitance and the related problems.

To reduce or minimise parasitic capacitance, it is desirable to manufacture the transistor such that the gate terminal is confined to covering just the semiconductive channel, and does not overlap either the source or drain terminals. However, how to achieve this accurate alignment is a technical problem.

For certain applications, there is motivation to use dielectric material having relatively high dielectric constant as the gate dielectric. For example, use of such high dielectric constant material (also known as high K material) can enable the dielectric layer to be made thinner, enabling thin film transistors to be constructed. However, the use of high K material can exacerbate the parasitic capacitance problem. For the same amount of overlap between the gate and source terminals, for example, the higher the dielectric constant of the dielectric material between them, the greater the parasitic capacitance will be (assuming all other factors are the same).

Thus, the motivation to use high K material as the gate dielectric in thin film transistors conflicts with the desire to reduce parasitic capacitance.

SUMMARY OF THE INVENTION

It is an aim of certain aspects and embodiments of the present invention to provide transistors, and methods of manufacturing transistors, which overcome, at least partially, one or more of the problems associated with the prior art.

According to a first aspect of the present invention there is provided a transistor comprising:

a layer (or other body) of semiconductor material comprising a first portion, a second portion, and a third portion connecting the first portion to the second portion and providing a semiconductive channel between the first portion and the second portion;

a conductive first terminal (e.g. a source terminal) covering and in electrical contact with said first portion of the layer of semiconductor material;

a conductive second terminal (e.g. drain terminal) covering and in electrical contact with said second portion of the layer of semiconductor material;

a conductive gate terminal comprising a first overlapping portion covering at least part of the first terminal, and a channel portion covering the third portion of the layer of semiconductor material; and a layer (or other body) of a first dielectric material, having a first dielectric constant, arranged between the first overlapping portion and the first terminal, and between the channel portion of the gate terminal and the third portion of the layer of semiconductor material, characterised in that the transistor further comprises a layer (or other body) of a second dielectric material having a second dielectric constant, said second dielectric constant being lower than said first dielectric constant, said layer of said second dielectric material being arranged between at least part of the first overlapping portion and the first terminal, whereby said at least part of the first overlapping portion of the gate terminal is separated from the first terminal by said layer of first dielectric material and said layer of second dielectric material.

Advantageously, therefore, by arranging the layer or other body of the second dielectric material between at least part of the first overlapping portion of the gate and the first terminal, the parasitic capacitance associated with that overlap is reduced compared with the value it would have were the second dielectric material not present (i.e. if the overlapping portion of the gate and the first terminal were separated only by the first dielectric material).

In certain embodiments, the second dielectric material is a low-K material, that is a material with a small dielectric constant relative to silicon dioxide. The dielectric constant of silicon dioxide is typically about 3.9 or 4. Thus, in certain embodiments the second dielectric constant may be 4, lower than 4, for example lower than 3.9, such as 3.5, 3.0, 2.0, or even lower. Generally, the lower the dielectric constant of the second dielectric material, the lower the parasitic capacitance of the transistor for a given geometry (i.e. a particular overlapping configuration of gate with respect to source and/or drain terminals and separation between the gate and underlying terminal or terminals).

In certain embodiments, said layer (or other body) of said second dielectric material is arranged to separate all of the first overlapping portion of the gate terminal from the first terminal. This helps minimise the parasitic capacitance resulting from the overlap. However, in certain alternative embodiments the layer or other body of second dielectric material may be arranged to cover just a portion (i.e. not all) of the first terminal.

In certain embodiments the layer or other body of second dielectric material may be arranged to cover all of the first terminal. Again, this helps minimise parasitic capacitance for a given amount of overlap between the gate and first terminal.

In certain embodiments the layer or other body of second dielectric material is arranged directly in contact with the first terminal (for example the second dielectric material may be formed directly on an upper surface of the first terminal). However, in alternative embodiments this arrangement is not essential, and in general the layer or other body of second dielectric material may be arranged at any position between the overlapping portion of gate and the underlying terminal, for example above or below the first dielectric material, or embedded within it, and may still achieve the desired effect of reducing parasitic capacitance compared with the situation were the second dielectric material not present.

In certain embodiments, the gate terminal comprises a second overlapping portion covering at least part of the second terminal, and said layer of first dielectric material is further arranged between the second overlapping portion and said second terminal.

In such embodiments, said layer (or other body) of said second dielectric material is further arranged between at least part of the second overlapping portion and the second terminal, whereby said at least part of the second overlapping portion of the gate terminal is separated from the second terminal by said layer of first dielectric material and said layer of second dielectric material.

Thus, by arranging the relatively low K dielectric material underneath each of the overlapping portions of the gate, the parasitic capacitance of the transistor is further reduced. In such embodiments, these portions of second dielectric material are portions of a common layer or other body of the second dielectric material. In alternative embodiments, rather than these portions of second dielectric material being portions of a common layer or body, they may be provided by separate layers or bodies, not connected to one another.

Thus, in certain embodiments the transistor may further comprise a further layer (or other body) of said second dielectric material, wherein said further layer of said second dielectric material is arranged between at least part of the second overlapping portion and the second terminal, whereby said at least part of the second overlapping portion of the gate terminal is separated from the second terminal by said layer of first dielectric material and said further layer of second dielectric material. Just the same as when the two portions of second dielectric material were provided by a common layer or body, in these embodiments there is still second dielectric material underneath each overlapping portion of the gate, and again parasitic capacitance is reduced.

In certain embodiments, said layer or further layer of said second dielectric material is arranged to separate all of the second overlapping portion of the gate terminal from the second terminal. Again, this helps further reduce or minimise parasitic capacitance resulting from overlap.

In certain embodiments, said layer or further layer of said second dielectric material is arranged to cover all of the second terminal. Again, this helps reduce parasitic capacitance.

In certain embodiments the layer or further layer of second dielectric material is arranged in contact with the second terminal, for example directly on an upper surface of that second terminal. However, in alternative embodiments the layer or further layer of second dielectric material may be arranged at any position between the overlaying second portion of the gate and the underlying second terminal, and will still provide the advantage of reducing parasitic capacitance.

In certain embodiments, said layer of said second dielectric material does not overlap said third portion of the layer of semiconductor material.

This can help increase or maximise the electrostatic coupling between the gate terminal and the third portion of the layer of semiconductor material (i.e. the channel portion).

In certain embodiments, the first dielectric material may have a dielectric constant of around 3.9 or 4. In alternative embodiments, the first dielectric material may be a high-K material, that is a material having a dielectric constant higher than 4. Advantageously, the layer or body of first dielectric material can be made relative thin, whilst the presence of the second dielectric material maintains a low parasitic capacitance for the device overall.

In certain embodiments the second dielectric material may be one of: benzocyclobutene, polyimide, parylene, organic silicate polymer.

Another aspect of the present invention provides a method of manufacturing a transistor comprising a layer (or other body) of semiconductor material comprising a first portion, a second portion, and a third portion connecting the first portion to the second portion and providing a semiconductive channel between the first portion and the second portion, the method comprising:

forming said layer (or other body) of semiconductor material;

forming a layer (or other body) of conductive material over (covering) said layer of semiconductor material;

forming a layer (or other body) of a second dielectric material (e.g. low-K material), having a second dielectric constant, over (covering) the layer of conductive material;

patterning the layers of conductive material and second dielectric material to expose (uncover) said third portion of the layer of semiconductor material, leave a first portion of the layer of conductive material covering the first portion of the layer of semiconductor material, leave a first portion of the layer of second dielectric material covering at least part of the first portion of the layer of conductive material, leave a second portion of the layer of conductive material covering the second portion of the layer of semiconductor material, and leave a second portion of the layer of second dielectric material covering at least part of the second portion of the layer of conductive material, the first and second portions of the layer of conductive material providing a source terminal and a drain terminal respectively;

forming a layer (or other body) of a first dielectric material, having a first dielectric constant, over the first and second portions of the layer of second dielectric material and over the exposed third portion of the layer of semiconductor material, said second dielectric constant being lower than said first dielectric constant; and forming a further layer (or other body) of conductive material over at least a portion of the layer of first dielectric material covering said third portion of the layer of semiconductor material to provide a gate terminal to which a potential may be applied to control a conductivity of the semiconductive channel.

Advantageously, by forming the layer or other body of second dielectric material and then patterning the layers of the conductive material and second dielectric material before forming the further layer or other body of conductive material to form a gate, this technique ensures that overlapping portions of the gate are separated from the source and drain terminal by second dielectric material as well as first dielectric material, and hence parasitic capacitance of the eventual transistor is reduced compared with an arrangement in which the second dielectric material were not present. Also, by forming the transistor in this way, the precise positioning of the gate relative to the source and drain terminals is less important, in the sense that overlap can be tolerated while still providing low parasitic capacitance, compared with prior art techniques where very accurate alignment was required in order to minimise overlap between the gate and underlying source and drain terminals to try to minimise parasitic capacitance.

In certain embodiments, said patterning of the layers of conductive material and second dielectric material comprises using a first mask (e.g. a gate mask).

In certain embodiments, said further layer of conductive material comprises at least one overlapping portion covering at least part of at least one of the source and drain terminals.

In certain embodiments, the further layer of conductive material comprises a first overlapping portion covering at least part of one of the source and drain terminals, and a second overlapping portion covering at least part of the other one of the source and drain terminals.

In certain embodiments, the further layer of conductive material covers the first, second, and third portions of the layer of semiconductor material.

In certain embodiments, the method further comprises patterning the further layer of conductive material. In such embodiments, the patterning of the further layer of conductive material may comprise using a second mask (e.g. a via mask).

In certain alternative embodiments, said forming of the further layer of conductive material comprises printing (e.g. selective printing) the further layer of conductive material.

In certain embodiments, said layer of conductor material further comprises a further portion extending from one of the first and second portions of the layer of conductor material.

In certain embodiments, said layer of a second dielectric material comprises a further portion covering said further portion of the layer of conductive material, said layer of a first dielectric material comprises a further portion covering said further portion of the layer of a second dielectric material, and the method further comprises:
patterning the layers of first dielectric material and second dielectric material to expose (uncover) at least part of the further portion of the layer of conductive material.

In certain embodiments, said further layer of conductive material comprises a further portion in contact with said at least part of the further portion of the layer of conductive material.

Certain transistors embodying the invention may further comprise at least one support layer (or other body) arranged to support the layer of semiconductor material. The at least one support layer or other body may comprise at least one of: an insulator; a barrier; a substrate; and a carrier.

In certain methods embodying the invention, the method may further comprise forming or providing at least one support layer (or other body) to support the layer of semiconductor material.

According to another aspect of the invention there is provided a transistor comprising:
a layer of semiconductor material comprising a first portion, a second portion, and a third portion connecting the first portion to the second portion and providing a semiconductive channel between the first portion and the second portion;
a conductive source terminal arranged over and in contact with said first portion of the layer of semiconductor material;
a conductive drain terminal arranged over and in contact with said second portion of the layer of semiconductor material;
a layer of a first dielectric material, having a first dielectric constant, arranged over at least a portion of the source terminal, over and in contact with the third portion of the layer of semiconductor material, and over at least a portion of the drain terminal; and
a conductive gate terminal arranged over and in contact with said layer of said first dielectric material and extending over said third portion of the layer of semiconductor material and extending over said portion of the source terminal and said portion of the drain terminal, characterised in that the transistor further comprises a layer of a second dielectric material having a second dielectric constant, said second dielectric constant being lower than said first dielectric constant, arranged over at least one of said portion of the source terminal and said portion of the drain terminal, between said layer of said first dielectric material and at least one of said portion of the source terminal and said portion of the drain terminal.

Another aspect of the invention provides a method of manufacturing a transistor comprising a layer of semiconductor material comprising a first portion, a second portion, and a third portion connecting the first portion to the second portion and providing a semiconductive channel between the first portion and the second portion, the method comprising:
forming said layer of semiconductor material;
forming a layer of conductive material over said layer of semiconductor material;
forming a layer of a second dielectric material, having a second dielectric constant, over the layer of conductive material;
patterning the layers of conductive material and second dielectric material to expose (uncover) said third portion of the layer of semiconductor material, leave a first portion of the layer of conductive material and a first portion of the layer of second dielectric material covering the first portion of the layer of semiconductor material, and leave a second portion of the layer of conductive material and a second portion of the layer of second dielectric material covering the second portion of the layer of semiconductor material, the first and second portions of the layer of conductive material providing a source terminal and a drain terminal respectively;
forming a layer of a first dielectric material, having a first dielectric constant, over the first and second portions of the layer of second dielectric material and over the exposed third portion of the layer of semiconductor material, said second dielectric constant being lower than said first dielectric constant; and
forming a layer of conductive material over at least a portion of the layer of first dielectric material covering said third portion of the layer of semiconductor material to provide a gate terminal to which a potential may be applied to control a conductivity of the semiconductive channel.

BRIEF DESCRIPTION OF THE DRAWINGS

Embodiments of the present invention will now be described with reference to the accompanying drawings, of which.

DETAILED DESCRIPTION OF EMBODIMENTS

Figure 1:
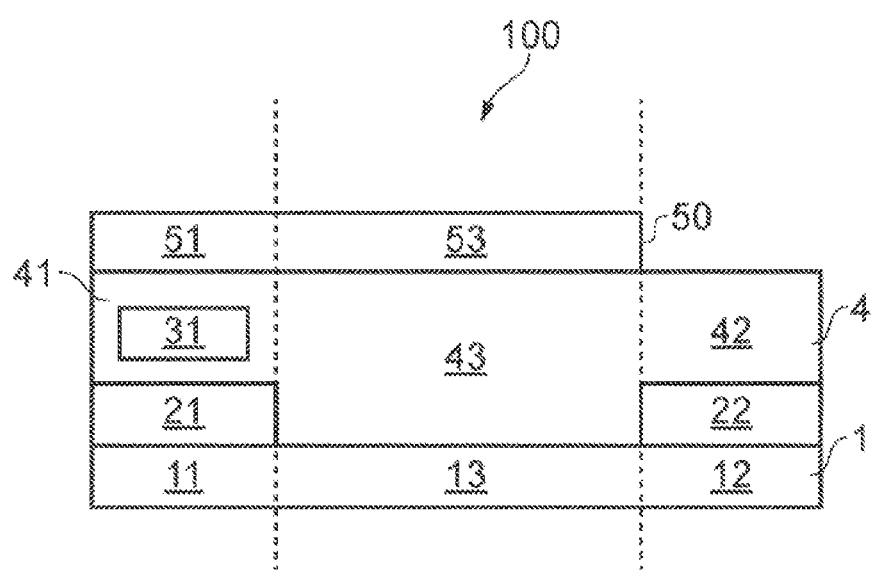
FIG. 1 is a schematic representation of a transistor embodying the invention.

Referring now to FIG. 1, this illustrates a transistor 100 embodying the invention. The transistor 100 comprises: a layer (or other body) of semiconductor material 1 comprising a first portion 11, a second portion 12, and a third portion 13 connecting the first portion to the second portion and providing a semiconductive channel between the first portion and the second portion; a conductive first terminal 21 (e.g. a source terminal) covering and in electrical contact with said first portion of the layer of semiconductor material; a conductive second terminal 22 (e.g. drain terminal) covering and in electrical contact with said second portion of the layer of semiconductor material; a conductive gate terminal 50 comprising a first overlapping portion 51 covering at least part of the first terminal 21, and a channel portion 53 covering the third portion 13 of the layer of semiconductor material; and a layer (or other body) of a first dielectric material 4, having a first dielectric constant, arranged between the first overlapping portion 51 and the first terminal, and between the channel portion 53 of the gate terminal and the third portion 13 of the layer of semiconductor material.

The transistor further comprises a layer (or other body) 31 of a second dielectric material 3 having a second dielectric constant, said second dielectric constant being lower than said first dielectric constant, said layer of said second dielectric material being arranged between at least part of the first overlapping portion and the first terminal. Thus, said at least part of the first overlapping portion of the gate terminal is separated from the first terminal by said layer of first dielectric material and said layer of second dielectric material.

In this embodiment, the first overlapping portion 51 of the gate covers all of the underlying first terminal 21 and the channel portion 53 of the gate 50 covers all of the underlying semiconductive channel 13. The gate 50 does not, in this embodiment, overlap the second terminal 22. In this example the layer or other body 31 of a second dielectric material is embedded in the portion 41 of the layer or other body of the first dielectric material 4. That layer or other body of second dielectric material 31 does not, in this example, cover the entire first terminal 21, but covers the majority of it. Thus, the presence of that layer or body 31 substantially reduces the parasitic capacitance which, at least in part, results from the position of the overlapping portion 51 of the gate above the first terminal 21. In alternative embodiments, however, the layer or body 31 may be arranged differently, and may cover the entire portion of the first terminal overlapped by the gate 50, as will be appreciated from the description of the embodiments below.

Figure 2:
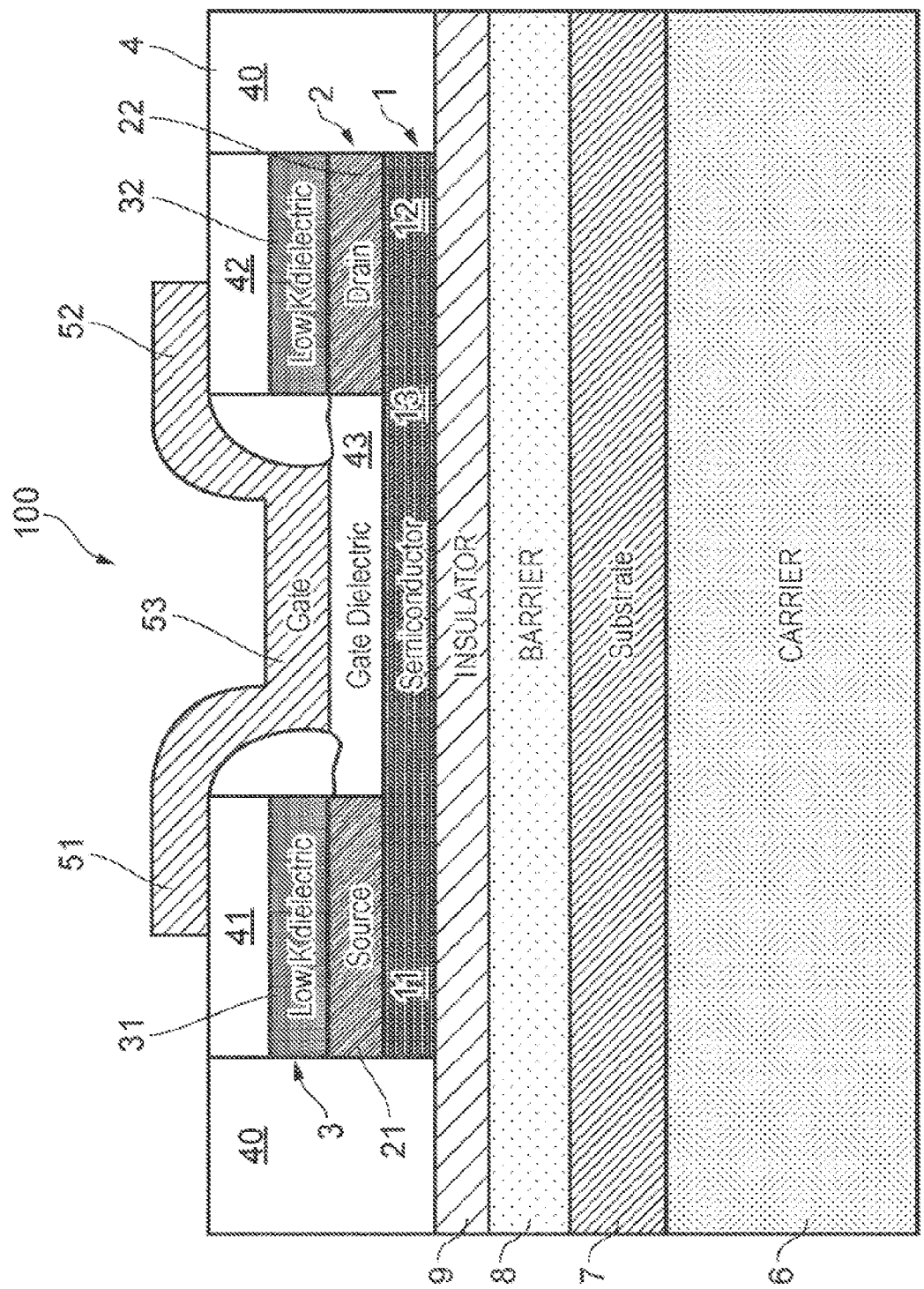
FIG. 2 is a schematic representation of another transistor embodying the invention.

Referring now to FIG. 2, this illustrates another transistor 100 embodying the invention. In this embodiment the layer or body of semiconductor material 1 is supported by a multi-layer support structure, in this example comprising a carrier 6, a substrate 7, a barrier layer 8, and an insulator layer 9. The layer of semiconductor material 1 has been formed on the upper surface of the insulator layer 9 and again comprises a first portion 11, a second portion 12, and a third portion 13. Source and drain terminals, 21 and 22 respectively, are formed on the first and second portions of the semiconductor layer, 11, 12, and in turn are, in this example, completely covered by first and second portions 31, 32 respectfully of a layer of low K material. Thus, the low K material completely covers each of the source and drain terminals. The layer or body 4 of first dielectric material is formed over the underlying structure, such that a first portion 41 covers the low K dielectric body 31, a second portion 42 covers the low K dielectric body 32, a third portion 43 covers the channel portion 13, and further portions 40 cover the insulator layer. The gate terminal 50 is formed on top, and comprises a channel portion 53 covering the semiconductor channel 13, a first overlapping portion 51 overlapping a portion of the source terminal but being separated from the source terminal by 41 and 31, and a second overlapping portion 52 overlapping part of the drain terminal 22, but again being separated from that drain terminal by both low K dielectric material 32 and first dielectric material 42.

A method suitable for manufacturing the transistor shown in FIG. 2 (that method also embodying the invention) is as follows:

(i) Prepare substrate 7 on carrier 6
(ii) Deposit barrier 8 (optionally)
(iii) Deposit insulator 9
(iv) Deposit semiconductor 1 (and optionally pattern)
(v) Deposit source-drain electrode layer 2
(vi) Deposit low-k dielectric layer 3
(vii) Pattern low-k dielectric layer 3 (to form regions/bodies 31 and 32)
(viii) Pattern source-drain electrode layer 2 (using patterned low-K layer as mask) to form source and drain terminals 21, 22
(ix) Deposit gate dielectric layer 4
(x) Pattern gate dielectric layer (optional)
(xi) Pattern low-k dielectric layer (optional)
(xii) Deposit gate layer 5
(xiii) Pattern gate layer 5

The optional second patterning of the low-k dielectric layer can use the gate dielectric layer (if patterned) as a hard-mask (if an appropriate material is chosen). The optional second step of patterning the low-k dielectric material creates a via to the SD (source-drain) electrode layer which can be used to connect to the gate electrode layer at the next stage.

It will be appreciated that in the transistor of FIG. 2 the gate partially overlaps both terminals 21, 22. However, each of the overlapping portions 51 and 52 is separated from the respective underlying terminal by low-k material, hence parasitic capacitance is kept low.

With regard to materials, the substrate may be flexible, and the substrate may be formed from a material selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyimide (e.g. Nylon); poly(hydroxyether); polyurethane; polycarbonate; polysulfone; polyarylate; polyetheretherketone (PEEK); acrylonitrile butadiene styrene; 1-Methoxy-2-propyl acetate (SU-8); polyhydroxybenzyl silsesquioxane (HSQ); polyimide; parylene; Benzocyclobutene (BCB); Al2O3, SiOxNy; SiO2; Si3N4; spin-on glass; UV-curable resin; Nanoimprint resist; photoresist.

Barrier may be a planarization layer, for example a UV curable polymer, spin-on glass, polyimide, BCB, SU8.

Insulator may be organic or inorganic, and is chosen to match the properties of the semiconductor layer. For example, a metal-oxide insulating material may be used to match a metal-oxide semiconductor. Such materials include SiO2, Al2O3, Ta2O5, HfO2, SiNx, which may be deposited by processes such as PVD, CVD or ALD, or using solution processes such as sol-gel, spray pyrolysis.

The semiconductor material may be n-type or p-type, and could be inorganic or organic. Examples of metal-oxide semiconductor materials include zinc oxide, tin oxide, cuprous oxide, nickel oxide. Other inorganic semiconductor such as amorphous, microcrystalline or nanocrystalline silicon; binary metal oxides such as zinc tin oxide, indium tin oxide, indium zinc oxide; ternary metal oxides such as GaInZnO; metal oxynitrides e.g. ZnxOyNz; organic or polymer semiconductors. Newer semiconductor materials such as 2D electronic materials e.g. MoS2, may also be used. The semiconductor layer may be deposited by a range of known techniques including PVD, CVD or ALD, printing (e.g. inkjet, aerosol-jet, gravure, flexo), spin-coating or other coating methods (such as doctor-blade, slot-die), or sol-gel and spray pyrolysis.

Electrode materials will be chosen to match the electronic properties of the semiconductor layer, for example to ensure efficient injection into the thin-film device. A range of metals are appropriate, such as Ni, Ti, Au, Mo, Al, or multi-layers of metals such as Ni/Au, Ti/Au, Ni/Pd, Ti/Al, Ag. conducting metal-oxides such as ITO, IZO, ZnO, AZO may also be appropriate choices or common electrode materials such as titanium nitride (TiN). As deposition processes mature 2D materials such as graphene or modified graphenes may be used. The choice of electrode must also be compatible with processing on the semiconductor layer without deleteriously affecting the desired properties. A range of deposition processes may be used including PVD, CVD or ALD, and other thin-film techniques well-known.

A range of low-k dielectric materials are well known within the electronics and semiconductor industry. These include inorganic materials, such as spin-on glass, and organic materials including polymers which are solution-processed (e.g. BCB, polyimide), sublimed/evaporated (parylene) or deposited by CVD. A typical k-value would range from 2.5 to 4. The choice of low-k material needs to be compatible with the underlying electrode material to ensure it can be patterned at the same time whilst minimising the isotropic (lateral) etching of the low-k material. Any lateral etching of the low-k material will introduce additional parasitic capacitance where the gate electrode overlaps with the source/drain electrode only across the high-k dielectric.

Figure 3:
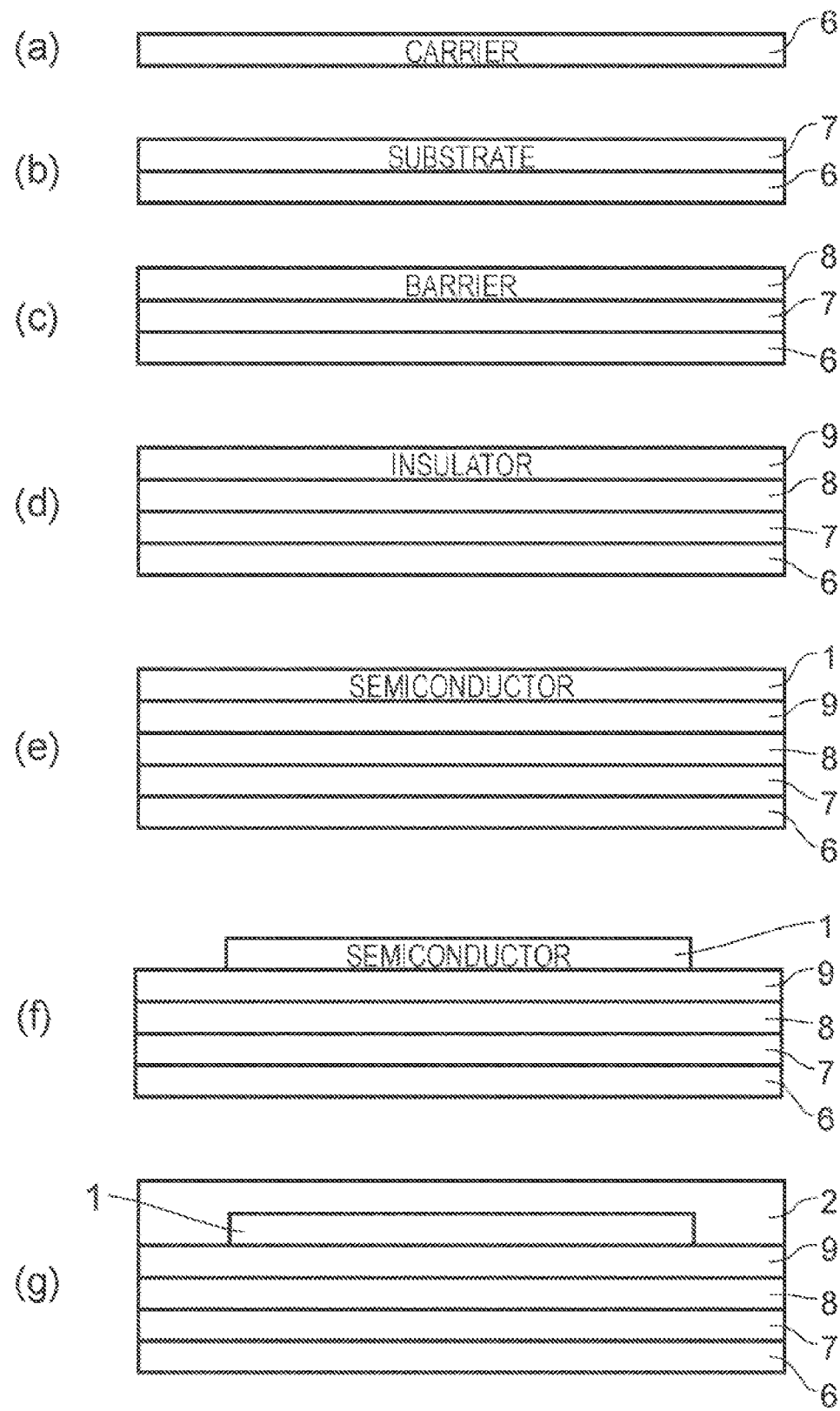
FIG. 3 illustrates steps A-O in a method of manufacturing a transistor in accordance with the present invention.
Figure 3:
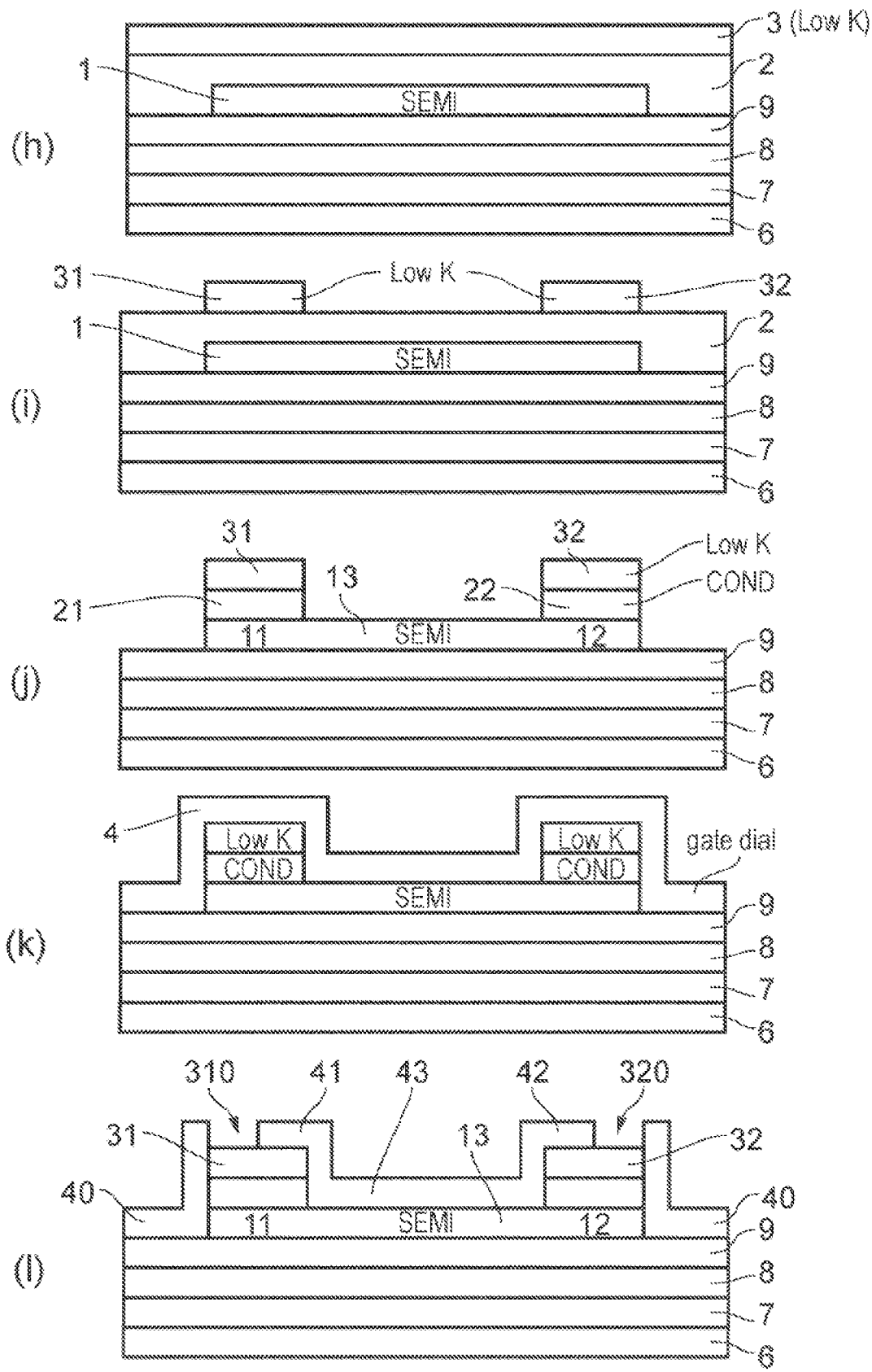
Figure 3:
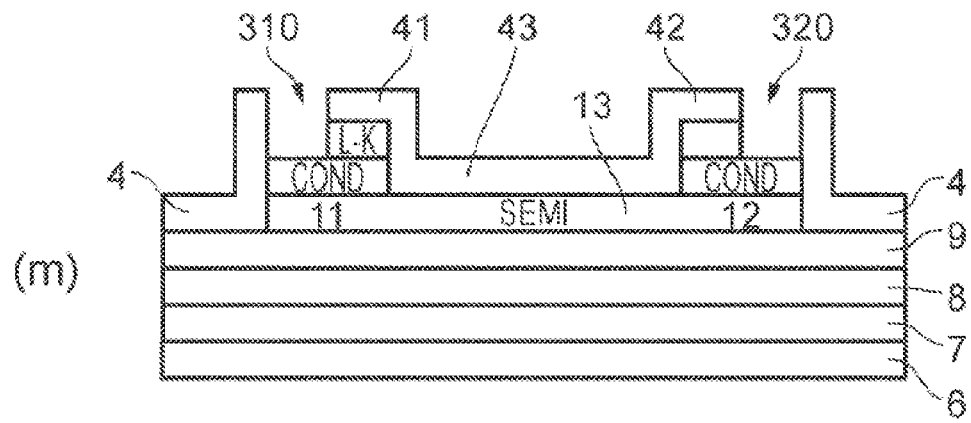
Figure 3:
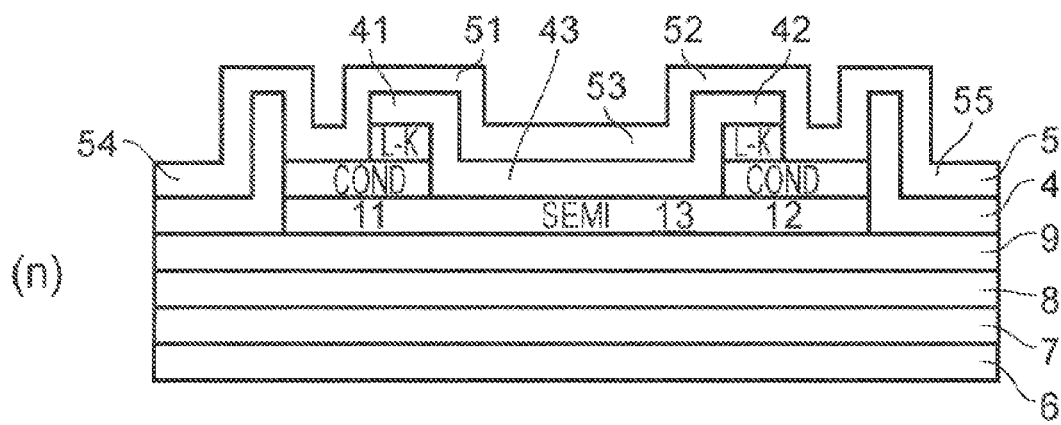
Figure 3:
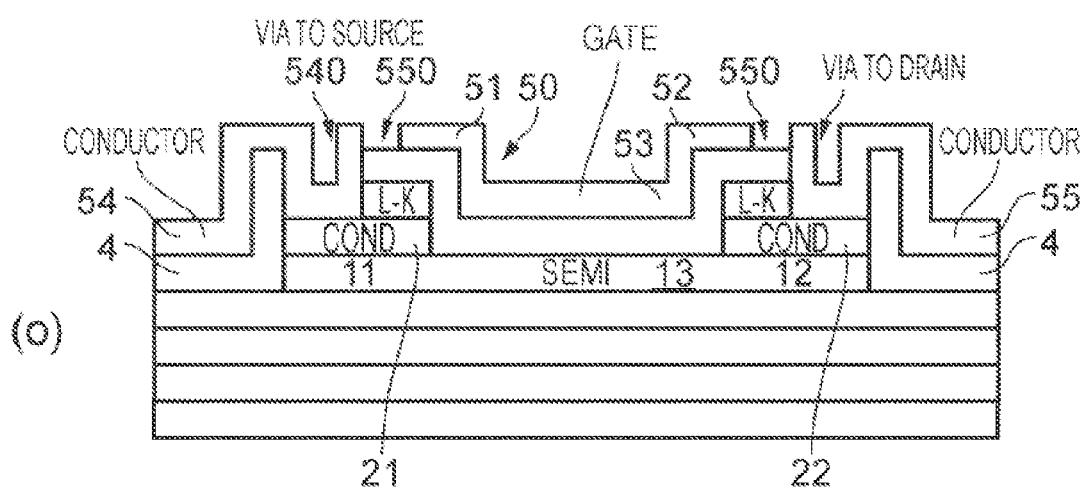

Referring now to FIG. 3, this illustrates steps in another method embodying the invention. In step A, a carrier 6 is provided. In step B, a substrate 7 is formed (e.g. deposited, printed, or otherwise provided) on a carrier. In step C a barrier layer 8 is formed (e.g. deposited) on the substrate. In step D, an insulator layer 9 is formed (e.g. deposited) on the barrier layer.

In step 3E the semiconductor layer or body is formed (e.g. deposited) on the insulator layer, and then in step F the semiconductor layer or body 1 is patterned. It will be appreciated that in alternative methods embodying the invention steps E and F may be replaced by a single step of selective deposition or printing of a patterned semiconductor layer.

In step G a conductor layer or body is formed (e.g. deposited) on the patterned semiconductor layer 1.

In step H a layer or body of second dielectric material (e.g. low-K material) is formed (e.g. deposited) over the conductor layer 2. Then, in step I, the second dielectric material layer is patterned. It will be appreciated that steps H and I could be replaced by a single step of selective deposition or printing of a patterned layer of second dielectric material.

In step 3J, using the portions 31 and 32 of low-K material as masks, the conductor layer 2 is patterned to leave first and second terminals 21 and 22 covering underlying first and second portions 11, 12 respectively of the semiconductor layer 1.

In step 3K, a gate dielectric layer 4 of first dielectric material is formed (e.g. deposited) over the underlying structure, and then in step 3L is patterned to leave a portion 43 covering the channel, a portion 41 overlapping part of the first terminal, a second portion 42 overlapping part of the second terminal 12, further portions 40 covering outlying surfaces of the layer 9, and windows 310 and 320 leaving exposed parts of the upper surfaces of the portions 31 and 32 of low-K material.

It will be appreciated that in certain embodiments steps K and L could be replaced by a single step of selectively depositing or printing a patterned gate dielectric layer.

In step 3M further patterning is performed, removing the exposed portions of the low-K material and exposing underlying surfaces of the first and second terminals 21, 22.

In step 3N a gate layer 5 of conductive material is formed (e.g. deposited) over the underlying structure. Then, in step 3O, the gate layer is patterned to form gaps or windows 550 separating the conductive material forming the gate 50 from further portions of conductive material 54 and 55. The portion of conductive material 54 partially fills the window 310 formed in step 3M, and forms a via (i.e. a connection) to the underlying source terminal 21. Similarly, a portion 55 at least partly fills the void 320 and forms a via connecting to the underlying drain terminal 22. The gate 50 has a channel portion 53 covering the channel portion 13, a first overlapping portion 51 overlapping part of the source 21, and a second overlapping portion 52 overlapping part of the drain 22. The presence of the low-K material underneath each of these overlapping portions 51, 52 substantially reduces the parasitic capacitance of the device.

It will be appreciated, that in certain alternative embodiments steps 3N and 3O could instead be replaced by a single step of selectively depositing or printing a patterned gate conductor layer.

Figure 4:
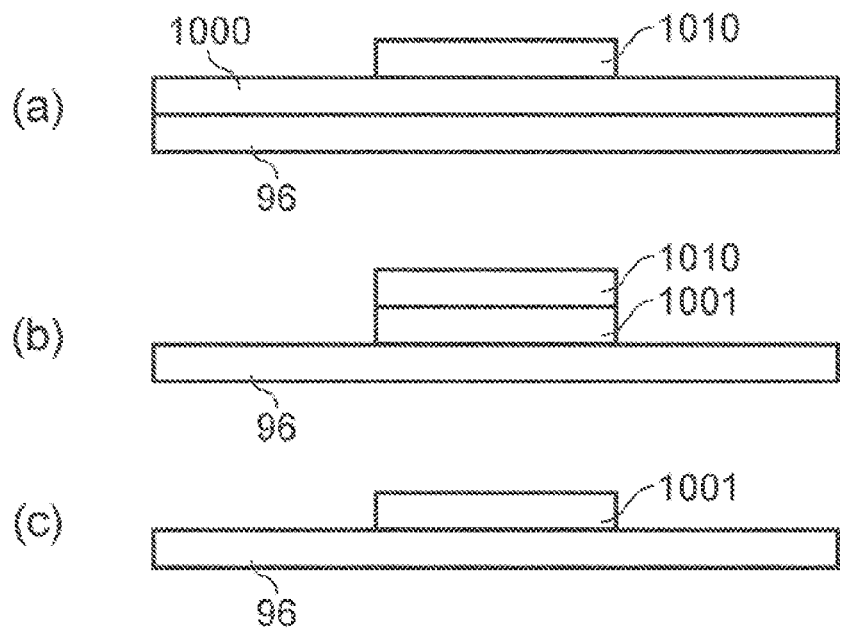
FIG. 4 illustrates steps A-C in the patterning of a layer in certain methods embodying the invention.

Referring now to FIG. 4, this illustrates steps in a technique suitable for patterning any layer, or multilayer structure, in methods embodying the invention. The layer to be patterned is labelled 1000. That layer 1000 is supported by a supporting layer, structure, or body 96 (which may take any suitable form, to suit requirements). In step 4a a mask 1010 is formed (e.g. deposited or printed) on or over the layer to be patterned 1000. Next, in step 4b, exposed (i.e. unmasked) portions of the layer 1000 are removed by any suitable technique (e.g. etching) to pattern the layer 1000. Finally, in step 4c, the mask 1010 is removed, leaving the patterned layer 1001 still supported by 96.

Figure 5:
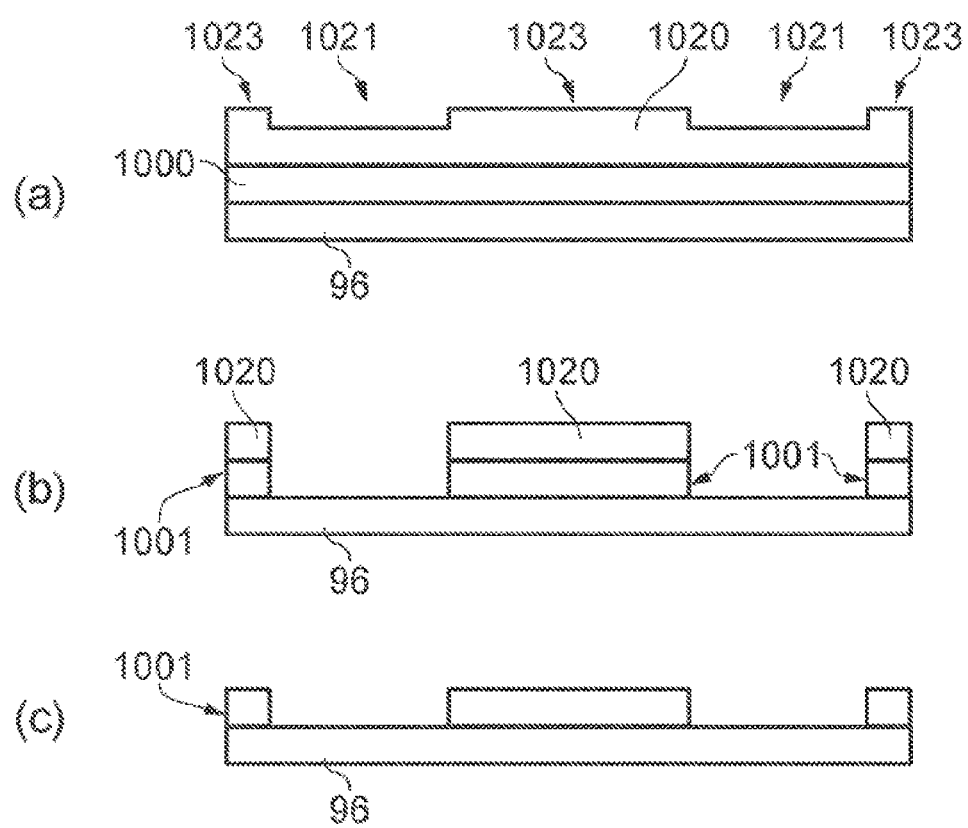
FIG. 5 illustrates alternative steps A-C suitable for patterning layers in embodiments of the present invention.

FIG. 5 illustrates an alternative patterning technique, which may be used in embodiments of the invention. Again, the layer 1000 to be patterned is provided on the support 96. As shown in FIG. 5a, a layer, body, or covering of resist material 1020 is formed over the layer to be patterned, with depressions 1021 in the upper surface of the resist layer defining the pattern. Between depressions 1021 are relatively thicker portions 1023 of the resist material. Those depressions may be formed by a variety of techniques, including imprinting, for example. In step 5b the depressions 1021 are developed by removing resist material (e.g. by etching) to an extent that portions of underlying layer 1000 are exposed, and then those exposed portions are also removed. In step 5c the remaining resist material is removed, to leave patterned layer 1001 on the support 96.

Additionally, or alternatively, patterned layers may be provided by printing (i.e. a patterned layer may be formed directly by printing), thereby avoiding the need to pattern after deposition (of an unpatterned layer/body).

Figure 6:
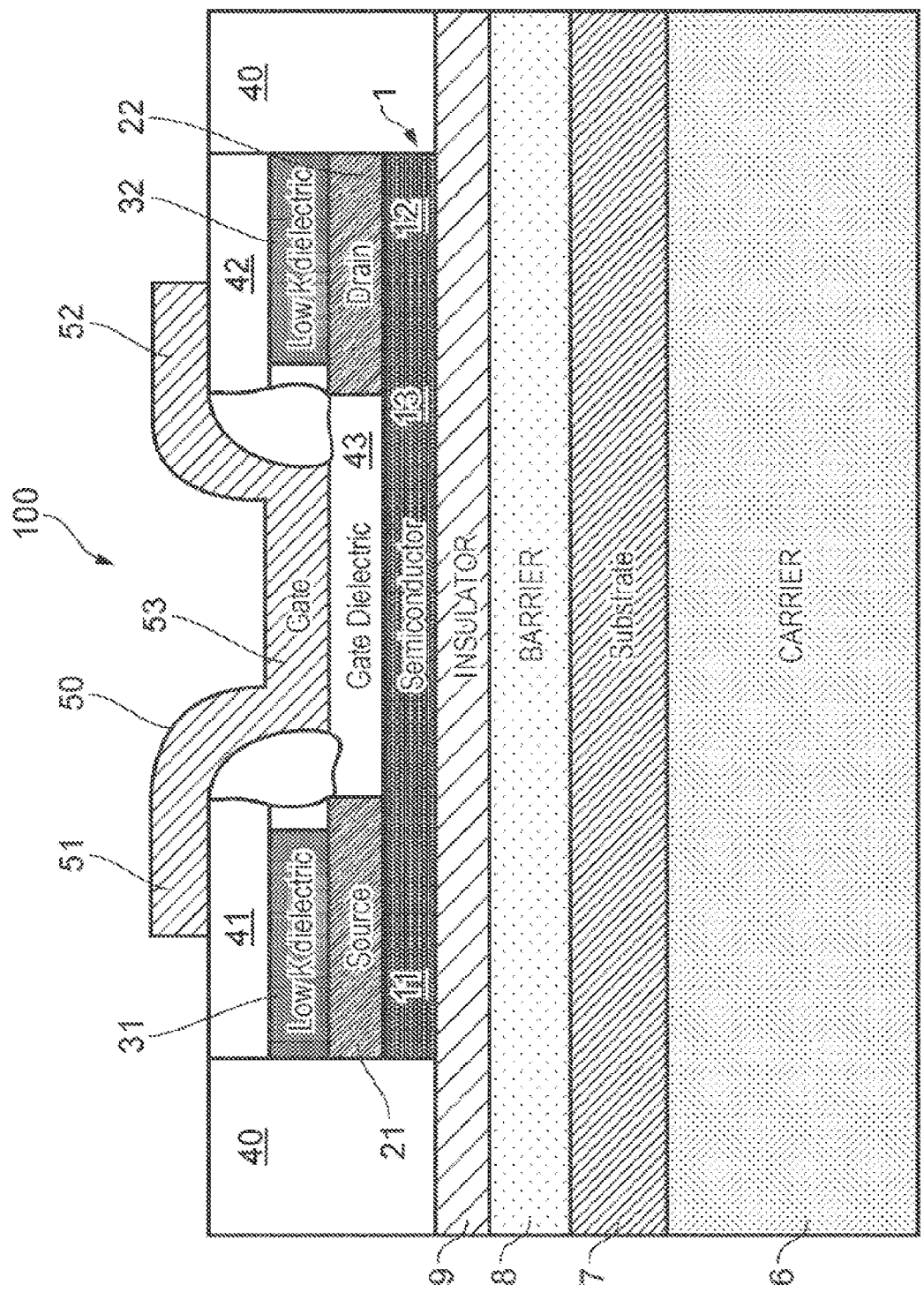
FIG. 6 illustrates another transistor embodying the invention.

Referring now to FIG. 6, this shows another transistor embodying the invention.

FIG. 6 shows some overlap of gate electrode to source/drain layer where there is no low-k dielectric. In other words, the portion or region 31 of low-k material does not entirely cover the source terminal 21, nor does the portion 32 completely cover the drain terminal 22. As this overlap increases the shielding effect of the low-k dielectric spacer layer will be reduced, and the overall parasitic capacitance increased. However, if the low k material covers the majority of the source and drain terminals (or at least the portions of them overlapped by the gate) then the overall parasitic capacitance may be kept acceptably low.

The gate dielectric material could be chosen from inorganic or organic. This material will be chosen to match the semiconductor material. A metal-oxide material, such as Al2O3, may be suitable for a metal-oxide semiconductor, such as IGZO. A range of deposition processes may be used including PVD, CVD or ALD, and other thin-film techniques well-known. The gate dielectric material will typically be a high-k dielectric material with k>4. Other examples include Ta2O5, HfO2, PVDF, BaTiO3.

The gate electrode materials can be selected from a range of conductive materials including metals such as Ni, Ti, Au, Mo, Al, or multi-layers of metals such as Ni/Au, Ti/Au, Ni/Pd, Ti/Al, Ag; conducting metal-oxides such as ITO, IZO, ZnO, AZO or other common electrode materials such as titanium nitride (TiN). A range of deposition processes may be used including PVD, CVD or ALD, and other thin-film techniques well-known.

Figure 7:
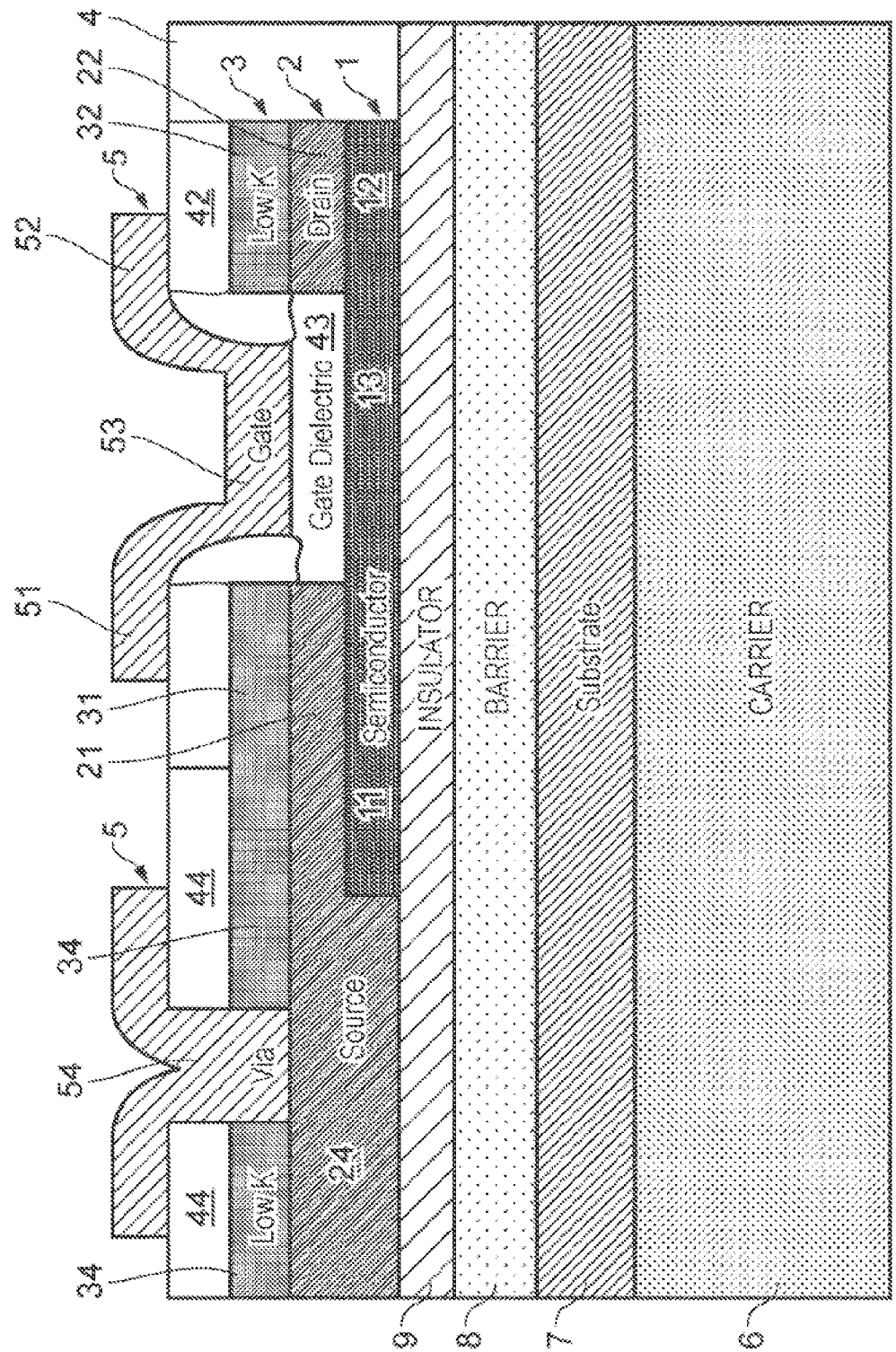
FIG. 7 illustrates part of an electronic circuit embodying the invention and incorporating a transistor embodying the invention.

Referring now to FIG. 7, this shows part of a circuit embodying the invention, and incorporating a transistor embodying the invention. The transistor 100 is generally as described with respect to FIG. 2. Additionally, the layer of conductor material 2 comprises a further portion 24 extending from the source terminal/region 21, and the low-k layer/body comprises a further portion 34, initially formed to cover the entire portion 24. Similarly, the first dielectric material layer/body comprises a further portion 44, initially formed to cover the entire portion 34. In one of its manufacturing steps, a hole through the portions 44 and 34 has been formed, to expose part of the upper surface of the portion 24 of conductor material. Then, when the layer of gate material has been formed, that conductive material 5 has also at least partially filled the hole to form a conductive via, making electrical connection to the underlying portion 24 and hence to the source terminal 21. Subsequent processing has then patterned the second layer of conductor material 5 to separate the portion forming the via 54 from the gate electrode 50 itself.

Figure 8:
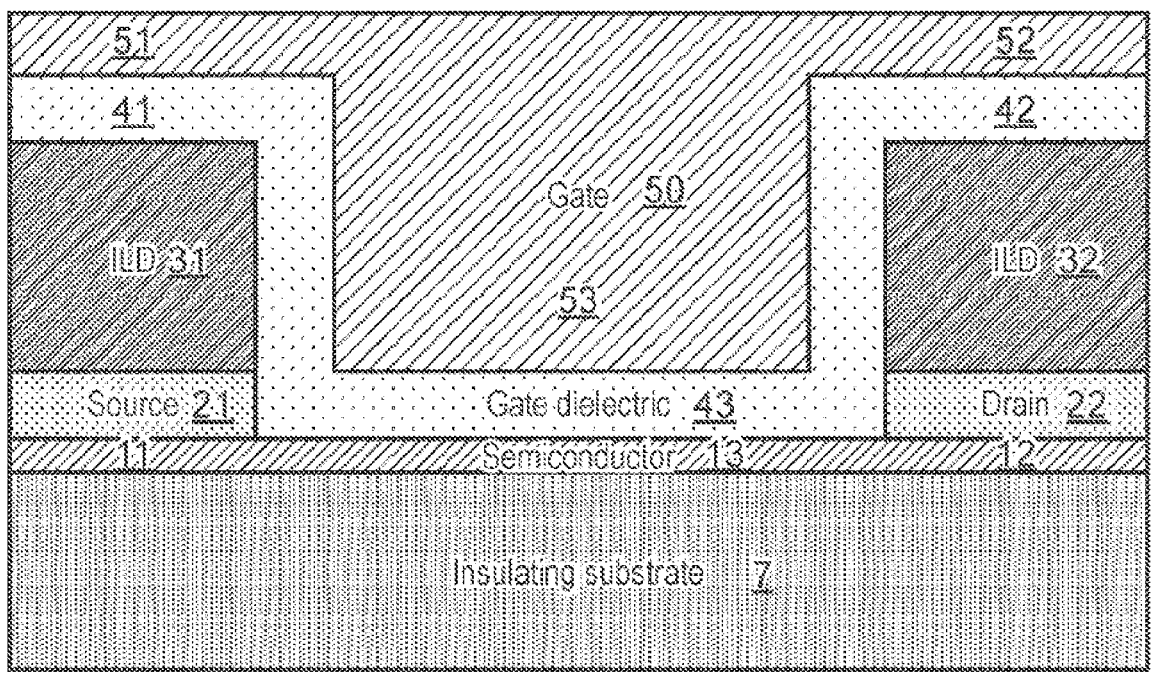
FIG. 8 illustrates another transistor embodying the invention.

In more detail, a method suitable for manufacturing the structure shown in FIG. 7 is as follows:

Process:
  (i) Prepare substrate 7 on carrier 6
  (ii) Deposit barrier 8 (optional)
  (iii) Deposit insulator 9
  (iv) Deposit semiconductor 1 (and optionally pattern)
  (v) Deposit source-drain electrode layer 2
  (vi) Deposit low-k dielectric layer 3
  (vii) Pattern low-k dielectric layer (forming gate mask)
    The gate mask opens up a window above the semiconductor channel 13 to form gate area with self-aligned channel
  (viii) Pattern source-drain electrode layer (to form source 21, drain 22, and further 24 regions)
  (ix) Deposit gate dielectric layer 4
  (x) Pattern gate dielectric layer (forming window through to region 34 to define position of via
  (xi) Pattern low-k dielectric layer (forming via mask). The via mask opens up a window above first metallisation layer (SD) to form via. This is disconnected from the rest of the gate layer by patterning. This layer could alternatively be selectively printed.
  (xii) Deposit gate layer 5
  (xiii) Pattern gate layer Referring now to FIG. 8, this shows another transistor embodying the invention.

An insulating substrate 7 is provided onto which a layer of semiconductor 1 is deposited. A conductor layer 2 is deposited onto layer 1, followed by a layer of low-k dielectric material 3. Layers 2 and 3 are patterned, for example using plasma-etch processing, to create window above semiconductor layer 1, creating segments 21, 22 and 31, 32 in layers 2 and 3, respectively. A further high-k dielectric material 4 is deposited onto the substrate covering exposed areas of layers 1, 2, and 3. A further conductor layer 5 is then deposited. The final structure is a top-contact, top-gate thin-film transistor comprising insulating substrate 7, semiconductor layer 1, source electrode 21, drain electrode 22, gate dielectric layer 4 and gate layer 5. Layer 3 provides a spacer or interlayer dielectric (ILD) between conductive layers 2 and 5. In doing so this reduces the "Miller Capacitance" of the device, well known in thin-film electronics.

In a further embodiment, the insulating substrate 7 is 200 um polyethylene terephthalate (PET) and a 50 nm layer of indium gallium zinc oxide (IGZO) is deposited by RF magnetron sputtering. A 100 nm layer of molybdenum (layer 2) is deposited by DC sputtering, followed by deposition of a 300 nm thick layer of parylene (layer 3). Photoresist S1805 (1.2 um) is spin-coated onto the substrate, soft-baked and then exposed through a photomask, hard-baked and then developed to expose a window onto the layer of parylene. The exposed parylene is removed using oxygen (O2) plasma to expose the top-surface of molybdenum. The exposed molybdenum is then removed using a CF4/O2 plasma to expose the top-surface of IGZO. The photoresist is then removed by flood-exposure (UV) and develop. A 100 nm layer of $Al_2O_3$ (layer 4) is deposited by atomic-layer deposition (ALD), followed by a 100 nm layer of molybdenum (layer 5) deposited by DC sputtering to provide the gate electrode.

Figure 9:
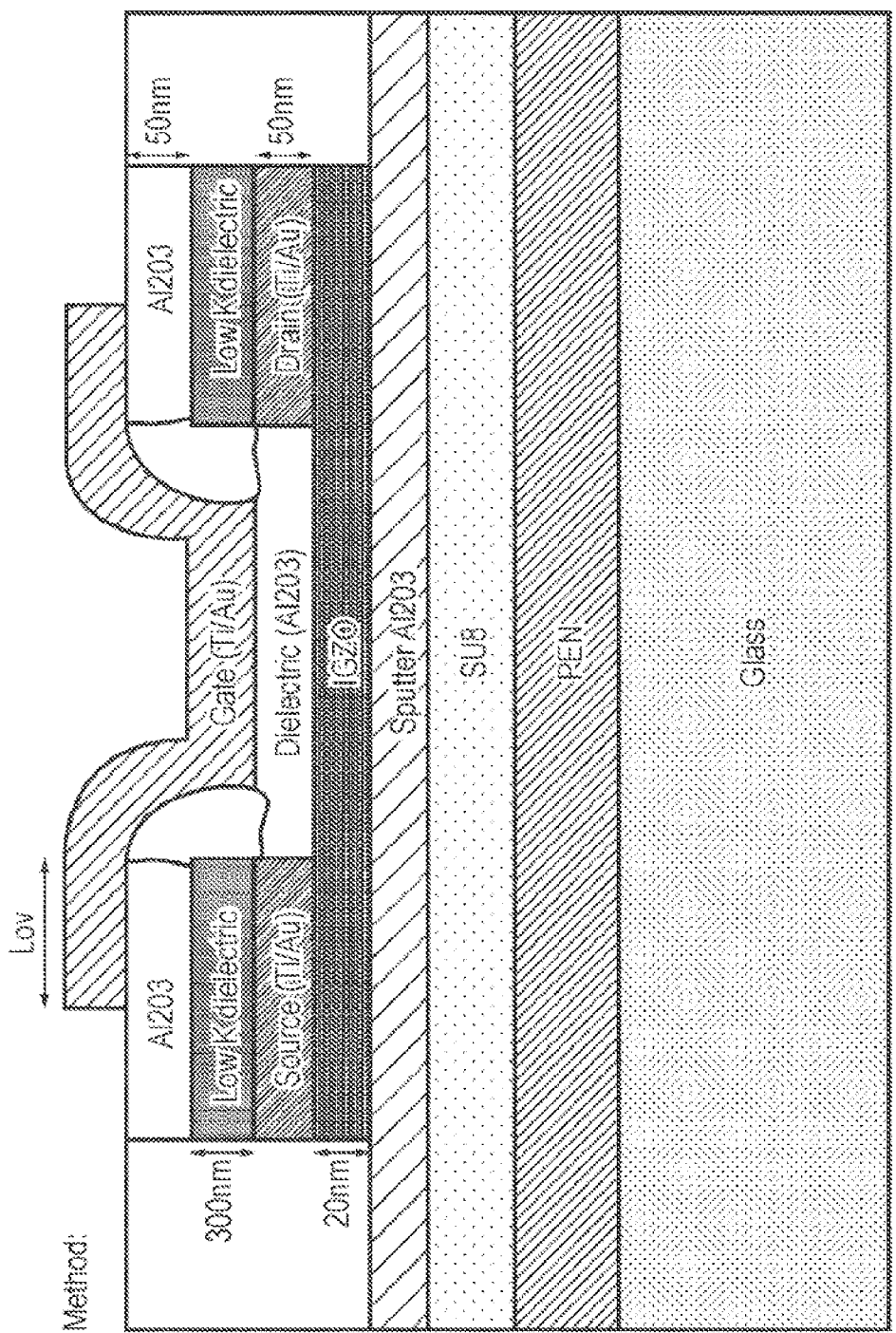
FIG. 9 illustrates another transistor embodying the invention.

FIG. 9 shows a further transistor embodying the invention, in particular a top contact configured metal oxide thin film transistor (TFT). Materials and dimensions are shown on the figure. The TFT Driver Dimensions were: L=1 um, 0.5 um, W=50 um. In this example the gate dielectric is alumina; dielectric constant 8, thickness 50 nm. The low K dielectric is a material with dielectric constant 4, thickness 300 nm. Length of overlap, Lov, approximately Lov=3 um. Calculations have indicated that such embodiments may exhibit TFT speeds approximately 2 to 6 times faster than equivalent TFTs without the low k material present.

It will be appreciated from the above description that certain methods embodying the invention provide a new process that enables "self-aligned" gate transistors with low miller capacitance to be manufactured. This process may use an in-situ etch-mask which is low-k (e.g. k<4) to spatially separate the gate metal from the SD layer. This avoids the need for reverse-side exposure.

The process may comprise the steps:
(i) Deposit semiconductor (optionally pattern)
(ii) Deposit SD layer
(iii) Deposit intermetal dielectric (IMD0)
(iv) Pattern IMD0+SD
(v) Deposit gate dielectric layer
(vi) Pattern gate dielectric
(vii) Optionally use gate dielectric layer as hard-mask to pattern IMD0 (to create via to SD layer)
(viii) Deposit gate metal layer
(ix) Pattern gate metal layer In certain embodiments, the gate dielectric is patterned and then used as a mask to pattern the low-K regions covering the S and D terminals to create via holes through to those terminals. The gate metal layer may then be formed, connecting to the SD layer by creating one or more vias. Subsequent patterning of the gate metal layer may then define whether these vias are connected or not. The vias are there to enable upper-level interconnects to be routed.

The invention claimed is:

1. A method of manufacturing a transistor comprising a layer of semiconductor material comprising a first portion, a second portion, and a third portion connecting the first portion to the second portion and providing a semiconductive channel between the first portion and the second portion, the method comprising:
forming said layer of semiconductor material;
forming a layer of conductive material over said layer of semiconductor material;
forming a layer of a second dielectric material, having a second dielectric constant, over the layer of conductive material;
patterning the layer of second dielectric material by forming a first mask on the layer of second dielectric material, removing unmasked portions of the layer of second dielectric material, and removing the first mask;
patterning the layer of conductive material using only the patterned layer of second dielectric material and etching through the layer of conductive material to expose said third portion of the layer of semiconductor material, leave a first portion of the layer of conductive material covering the first portion of the layer of semiconductor material, leave a first portion of the layer of second dielectric material covering at least part of the first portion of the layer of conductive material, leave a second portion of the layer of conductive material covering the second portion of the layer of semiconductor material, and leave a second portion of the layer of second dielectric material covering at least part of the second portion of the layer of conductive material, the first and second portions of the layer of conductive material providing a source terminal and a drain terminal respectively;
forming a layer of a first dielectric material, having a first dielectric constant, over the first and second portions of the layer of second dielectric material and over the exposed third portion of the layer of semiconductor material, said second dielectric constant being lower than said first dielectric constant; and
forming a further layer of conductive material over at least a portion of the layer of first dielectric material covering said third portion of the layer of semiconductor material to provide a gate terminal to which a potential may be applied to control a conductivity of the semiconductive channel,
and wherein said further layer of conductive material comprises at least one overlapping portion covering at least part of at least one of the source and drain terminals.

2. The method in accordance with claim 1, wherein the further layer of conductive material comprises a first overlapping portion covering at least part of one of the source and drain terminals, and a second overlapping portion covering at least part of the other one of the source and drain terminals.

3. The method in accordance with claim 1, wherein the further layer of conductive material covers all of the first, second, and third portions of the layer of semiconductor material.

4. The method in accordance with claim 1, further comprising patterning the further layer of conductive material.

5. The method in accordance with claim 4, wherein said patterning of the further layer of conductive material comprises using a third mask.

6. The method in accordance with claim 1, wherein said forming of the further layer of conductive material comprises printing the further layer of conductive material.

7. The method in accordance with claim 1, wherein said layer of conductor material further comprises a further portion extending from one of the first and second portions of the layer of conductive material.

8. The method in accordance with claim 7, wherein said layer of a second dielectric material comprises a further portion covering said further portion of the layer of conductive material, said layer of a first dielectric material comprises a further portion covering said further portion of the layer of a second dielectric material, and the method further comprises:
patterning the layers of first dielectric material and second dielectric material to expose at least part of the further portion of the layer of conductive material.

9. The method in accordance with claim 8, wherein said further layer of conductive material comprises a further portion in contact with said at least part of the further portion of the layer of conductive material.

10. The method in accordance with claim 1, further comprising providing at least one support layer to support the layer of semiconductor material.

* * * * *